(12) United States Patent
Yoshikoshi

(10) Patent No.: US 6,348,722 B1
(45) Date of Patent: Feb. 19, 2002

(54) SEMICONDUCTOR MEMORY WITH SHIELD LAYER

(75) Inventor: Takeshi Yoshikoshi, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/643,449

(22) Filed: Aug. 22, 2000

(30) Foreign Application Priority Data

Aug. 24, 1999 (JP) .......................................... 11-237650

(51) Int. Cl.$^7$ .............................................. H01L 27/10
(52) U.S. Cl. ...................... 257/508; 257/208; 257/659; 438/454
(58) Field of Search ................................ 257/207, 208, 257/209, 211, 202, 659, 508; 438/128, 129

(56) References Cited

U.S. PATENT DOCUMENTS 3,612,744 A * 10/1971 Thomas ........................ 174/36
6,088,283 A * 7/2000 Hayashi ................. 365/230.03

FOREIGN PATENT DOCUMENTS

JP          2751591          2/1998

* cited by examiner

Primary Examiner—Olik Chaudhuri
Assistant Examiner—Dilinh P. Nguyen
(74) Attorney, Agent, or Firm—Hutchins, Wheeler & Dittmar

(57) ABSTRACT

A fast-response semiconductor memory which can avoid noises from over-macro through wiring affecting macro wiring and reduce the parasitic capacitance appearing on the macro wiring as well. The semiconductor memory has a shield layer between RAM macro wiring inside a macro and through wiring over the macro. The shield layer has a plurality of conductive layers arranged parallel to each other at a pitch of $W_1$, the conductive layers extending in the direction orthogonal to the RAM macro wiring. For an appropriate length of the RAM macro wiring, this shield layer is provided so that the pitch $W_1$ of the conductive layers is equal to or smaller than $P_1$, where $P_1$ is a pitch of the conductive layers at which the interlayer capacitance between the RAM macro wiring and the shield layer becomes equal to the interlayer capacitance between the RAM macro wiring and the over-macro through wiring.

8 Claims, 6 Drawing Sheets

SEMICONDUCTOR MEMORY WITH SHIELD LAYER

BACKGROUND OF THE INVENTION

1. Field of the Invention

The invention relates to a semiconductor memory, and more particularly to a semiconductor memory in which noises between wiring layers are prevented to enhance read and write speeds.

2. Description of the Related Art

Semiconductor memories such as a static random access memory (SRAM) have parasitic capacitance. The parasitic capacitance includes substrate capacitance between a substrate and wiring on the substrate, interlayer capacitance formed between RAM macro wiring and over-macro through wiring, and lateral capacitance caused between wires. The substrate capacitance and the interlayer capacitance are extremely high as compared with the lateral capacitance.

In recent years, the concept of lateral capacitance is changing as devices are getting finer. That is, with increasing fineness, wiring decreases in area component to lower interlayer capacitance which is proportional to the area of the wiring, whereby lateral capacitance forms an increasing proportion of the parasitic capacitance.

Conventionally, such lateral capacitance and other stray capacitance, or electric capacitances at portions other than required, have been taken into account through the optimizations of transistor size and wiring arrangement.

For example, Japanese Patent No. 2751591 discloses a method of fabricating a semiconductor memory device for reducing the stray capacitance of a dynamic random access memory (DRAM) to improve characteristics including responsivity (prior art 1). FIGS. 1 and 2 are top views of semiconductor memory devices described in the prior art 1. As shown in FIG. 1, bit lines 101 of low specific resistance polycrystalline silicon, aluminum, or the like are formed parallel to one another on a semiconductor substrate (not shown) by chemical-vapor deposition (CVD) or sputtering. Formed over the bit lines 101 is an interlayer insulation film 102. The interlayer insulation film 102 is subjected to inert gas such as $N^{2+}$ and $He^+$ with a dose of the order of $10^{14}$ to $10^{15}$ cm$^{-2}$ or higher for ion implantation. Some of the gas molecules are not dissolved into the interlayer insulation film 102 completely, and remain inside the interlayer insulation film 102 as bubbles, forming a plurality of fine cavities. On this interlayer insulation film 102 is formed a shield conductive layer 104 having openings 103 of stripe configuration along the direction orthogonal to the bit lines 101. This shield layer 104 is a (½) VDD (power supply) layer formed of, e.g., the same polycrystalline Si or the like as that of the bit lines. This shield layer absorbs electrostatic induction caused between the bit lines.

In FIG. 2, an interlayer insulative film 102 having fine cavities is formed as described above. Then, a conductive layer is formed thereon. Furthermore, the conductive layer is provided with openings 105 to form a shield conductive layer 106 having a mesh-like pattern.

Such formation of a plurality of fine cavities inside the interlayer insulation film can substantially lower the relative permittivity of the insulation layer in between the bit lines and the shield conductive layer. Moreover, the provision of openings in the shield conductive layer can reduce the area for the shield conductive layer to overlap with the bit lines. This allows a reduction of the capacitance between the bit lines and the shield conductive layer.

Moreover, some SRAMs with reduced spacings between wires and between wiring layers for higher integration have a shield layer between the wiring layers so that noises from the wiring passing over a RAM are prevented from causing the internal wiring of the RAM to malfunction (prior art 2).

FIG. 3 is a perspective view showing an SRAM in the prior art 2. FIGS. 4 and 5 are views showing the SRAM of the prior art 2. FIG. 4 is a bottom view showing how the shield layer and the RAM macro wiring shown in FIG. 3 overlap with each other. FIG. 5 is a schematic diagram showing the interlayer capacitance between the shield layer and the RAM macro wiring in a cross section along the RAM macro wiring shown in FIG. 3. As shown in FIG. 3, a shield layer 11 consisting of an Al full layer is formed between RAM macro wiring 1 and over-macro through wiring 3 above, which lies above the RAM macro wiring 1 and passes over the RAM macro. The RAM macro wiring 1 and the over-macro through wiring 3 must not interfere with each other in operation, for the interference would cause a RAM malfunction. The shield layer 11 is thus formed all over the RAM macro, whereby the RAM macro wiring 1 inside the RAM can be prevented from the influence of the noises caused by the over-macro through wiring 3, so as to avoid a RAM malfunction.

Nevertheless, while the shield layer in the prior art 1 absorbs the capacitance appearing between bit lines by dissipating electric lines of force extending between the bit lines therethrough, no consideration is given to noises appearing between wiring layers. Besides, finer wiring makes a reduction in the wiring are to lower the interlayer capacitance between wiring layers, whereas that interlayer capacitance still forms a major proportion of all interlayer capacitances. In the prior art 1, the shield layer is provided with openings so that the overlapping area of the shield layer and the bit lines decreases to reduce the interlayer capacitance between the bit lines and the shield layer, which is proportional to the size of the area. This, however, leaves a problem in that the parasitic capacitance other than that between the bit lines and the shield conductive layer cannot be reduced.

Moreover, the shield layer in the prior art 2 has the problem that the interlayer capacitance between the RAM macro wiring and the shield layer is extremely high.

As seen from above, wires are under various types of parasitic capacitance, and in even finer wiring, the capacitance appearing between macro wiring and a substrate and the interlayer capacitance appearing between the macro wiring layer and another layer occupy great proportions as compared with the wire-to-wire capacitance caused between wires. While reductions have been conventionally made on the wire-to-wire capacitance caused between wires, no sufficient measures are taken against interlayer capacitance heretofore. The reduction in interlayer capacitance, if made possible, would allow higher levels of semiconductor devices, which extremely advantageously enables higher integration of semiconductor devices within limited specifications. This interlayer capacitance, however, has heretofore remained as the factor to preclude the higher integration of semiconductor devices.

SUMMARY OF THE INVENTION

An object of the present invention is to provide a fast-response semiconductor memory which can avoid noises from over-macro through wiring affecting macro wiring and reduce the parasitic capacitance appearing on the macro wiring as well.

A semiconductor memory according to the present invention comprises a shield layer between macro wiring inside a macro and through wiring over the macro. The shield layer has a plurality of conductive layers arranged parallel to each other at a pitch of $W_1$, the conductive layers extending in a direction orthogonal to the macro wiring. The pitch $W_1$ of the conductive layers is equal to or smaller than $P_1$, where $P_1$ is a pitch of the conductive layers at which the interlayer capacitance between the macro wiring and the shield layer becomes equal to the interlayer capacitance between the macro wiring and the over-macro through wiring.

Another semiconductor memory according to the present invention comprises a mesh-like shield layer between macro wiring inside a macro and through wiring over the macro. The shield layer has a plurality of openings each having an opening width of $W_2$ along the longitudinal direction of the macro wiring. The opening width $W_2$ is equal to or smaller than $P_2$, where $P_2$ is an opening width at which the interlayer capacitance between the macro wiring and the shield layer becomes equal to the interlayer capacitance between the macro wiring and the over-macro through wiring.

According to the present invention, a shield layer of stripe configuration, consisting of a plurality of conductive layers arranged at an appropriate pitch, or a shield layer of mesh configuration is provided between the over-macro through wiring and the macro wiring. Since the shield layer is not of plate configuration as heretofore but of stripe configuration or of mesh configuration, first interlayer capacitance appearing between the shield layer and the macro wiring is reduced due to a decrease in the area of the conductor(s) opposed to the macro wiring. Meanwhile, the macro wiring and the over-macro through wiring generate second interlayer capacitance in the regions between the stripe conductive layers or in the openings. Nevertheless, appropriate selections on the conductive layer pitch or the opening width can make the generation of the second interlayer capacitance smaller than the reduction of the first interlayer capacitance, ending up with lower interlayer capacitance to the macro wiring.

The nature, principle, and utility of the invention will become more apparent from the following detailed description when read in conjunction with the accompanying drawings in which like parts are designated by like reference numerals or characters.

BRIEF DESCRIPTION OF THE DRAWINGS

In the accompanying drawings:

FIGS. 10A and 10B are schematic diagrams showing electric lines of force extending from the RAM macro wiring 1 inside a semiconductor device, in which FIG. 10A shows the aspects of the electric lines of force in a cross section taken along the macro wiring 1 in FIG. 9, FIG. 10B shows the aspects of the electric lines of force in a cross section along the conductive layer 2a in FIG. 9;

DETAILED DESCRIPTION OF THE PREFERRED EMBODIMENT

Figure 6:
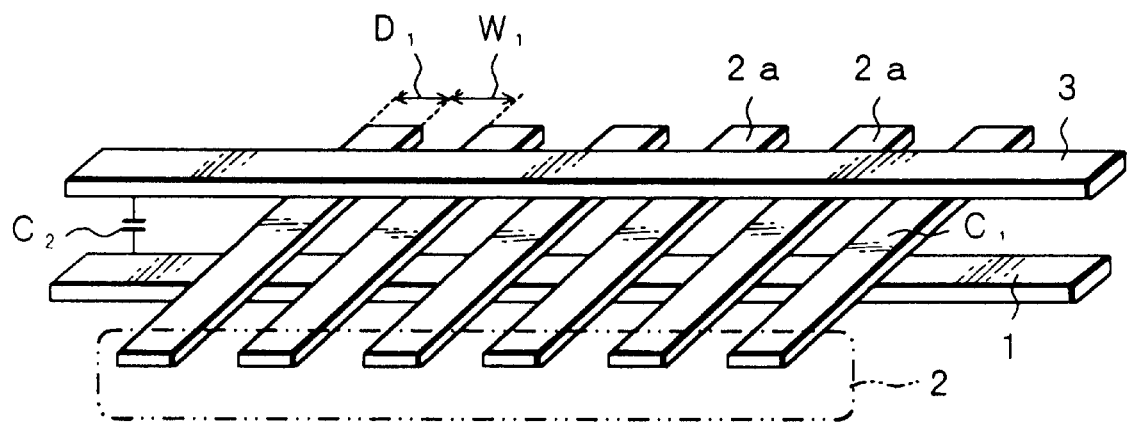
FIG. 6 is a perspective view showing the SRAM according to a first embodiment of the present invention.

Hereinafter, embodiments of the present invention will be described concretely with reference to the accompanying drawings. FIG. 6 is a perspective view showing the semiconductor memory (SRAM) according to a first embodiment of the present invention.

As shown in FIG. 6, the SRAM includes RAM macro wiring 1 and over-macro through wiring 3, which are the wiring inside a macro and external wiring passing over the macro, respectively. The RAM macro wiring 1 and the over-macro through wiring 3 could interfere with each other in operation to cause a RAM malfunction. A shield layer 2, or a conductive layer, is therefore formed between the RAM macro wiring 1 and the over-macro through wiring 3 so as to prevent the interference. The shield layer 2 is formed of e.g. Al or the like, and is connected with e.g. GND.

In the SRAM configured thus, the operation of the RAM macro circuit causes a VDD potential and a GND potential to appear alternately on the RAM macro wiring 1. Similarly, the potential of the over-macro through wiring 3 varies between the VDD potential and the GND potential. The shield layer 2 arranged between the wirings 1 and 3 making such potential changes is constant in potential. Thus, the shield layer 2 shields signals on the over-macro through wiring 3 above, whereby the signals are prevented from acting as noises upon the RAM macro wiring 1 beneath the shield layer 2. This makes it possible to prevent the RAM macro wiring 1 from malfunctioning due to the noises from the over-macro through wiring 3.

In this GND shield layer 2 comprises a plurality of conductive layers 2a of stripe configuration, extending in the direction orthogonal to the RAM macro wiring 1 and being arranged parallel to one another at a pitch of $W_1$. The width of a conductive layer 2a is $D_1$, and the pitch between adjoining conductive layers 2a is $W_1$. Assume that for an appropriate length L of the RAM macro wiring 1, the pitch of the conductive layers 2a at which the interlayer capacitance $C_1$ formed between the RAM macro wiring 1 and the shield layer 2 becomes equal to the interlayer capacitance $C_2$ generated between the RAM macro wiring 1 and the over-macro through wiring 3 is $P_1$. Then, the pitch $W_1$ of the conductive layers 2a is equal to or smaller than $P_1$. This is the optimum pitch range. Incidentally, the shield layer 2 in the present embodiment may be connected with VDD.

The shield layer 2 for preventing the RAM macro wiring 1 from the noises of the over-macro through wiring 3 is thus formed in stripes to reduce the overlapping area of the RAM macro wiring 1 and the shield layer 2 as compared with the case where the shield layer 2 is formed over the entire area. This can reduce the interlayer capacitance $C_1$ between the RAM macro wiring 1 and the shield layer 2, proportional to the dimensions of the area. The stripe configuration of the shield layer 2 also generates interlayer capacitance between the RAM macro wiring 1 and the over-macro through wiring 3 in the regions between the conductive layers 2a. Nevertheless, the pitch $W_1$ of the conductive layers 2a constituting the shield layer 2 can be made equal to or smaller than $P_1$ so that the interlayer capacitance $C_2$ generated between the RAM macro wiring 1 and the over-macro through wiring 3 is suppressed to prevent noises caused by the over-macro through wiring 3 from affecting the RAM macro wiring 1.

As mentioned above, the operation of the RAM macro circuit changes the potentials to be supplied to the RAM macro wiring 1 and the over-macro through wiring 3. With the shield layer 2 at the GND potential, the interlayer capacitance $C_1$ therefore appears when the potential supplied to the RAM macro wiring 1 is the VDD potential. The interlayer capacitance $C_2$ appears when the RAM macro wiring 1 is supplied with the VDD potential and the over-macro through wiring 3 is supplied with the GND potential, or when the RAM macro wiring 1 is supplied with the GND potential and the over-macro through wiring 3 is supplied with the VDD potential, i.e., when the two wirings have a potential difference therebetween.

Figure 9:
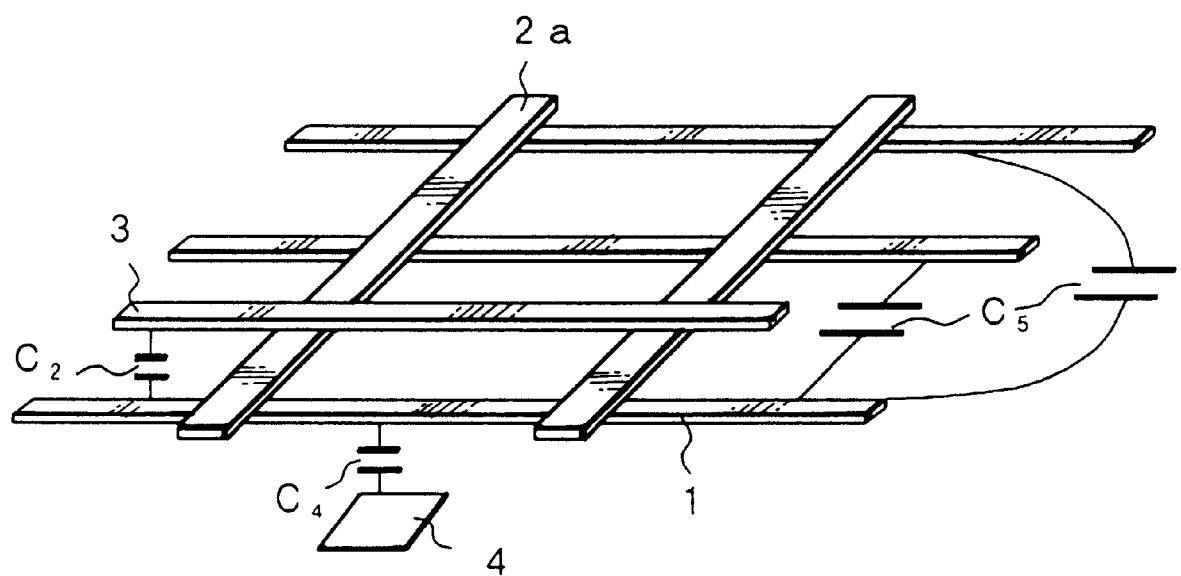
FIG. 9 is a perspective view showing the relation of the parasitic capacitance to RAM macro wiring.

Hereinafter, description will be given of the reason why the pitch $W_1$ of the conductive layers 2a has the optimum range of $P_1$ and smaller. FIG. 9 is a perspective view showing the relation of the parasitic capacitance to the RAM macro wiring 1. The parasitic capacitance includes to-substrate capacitance $C_4$ formed between the RAM macro wiring 1 and a substrate 4, lateral capacitance $C_5$ formed between adjoining or adjacent RAM macro wirings 1, and the interlayer capacitance $C_2$ formed between the RAM macro wiring 1 and the over-macro through wiring 3.

Figure 10A:
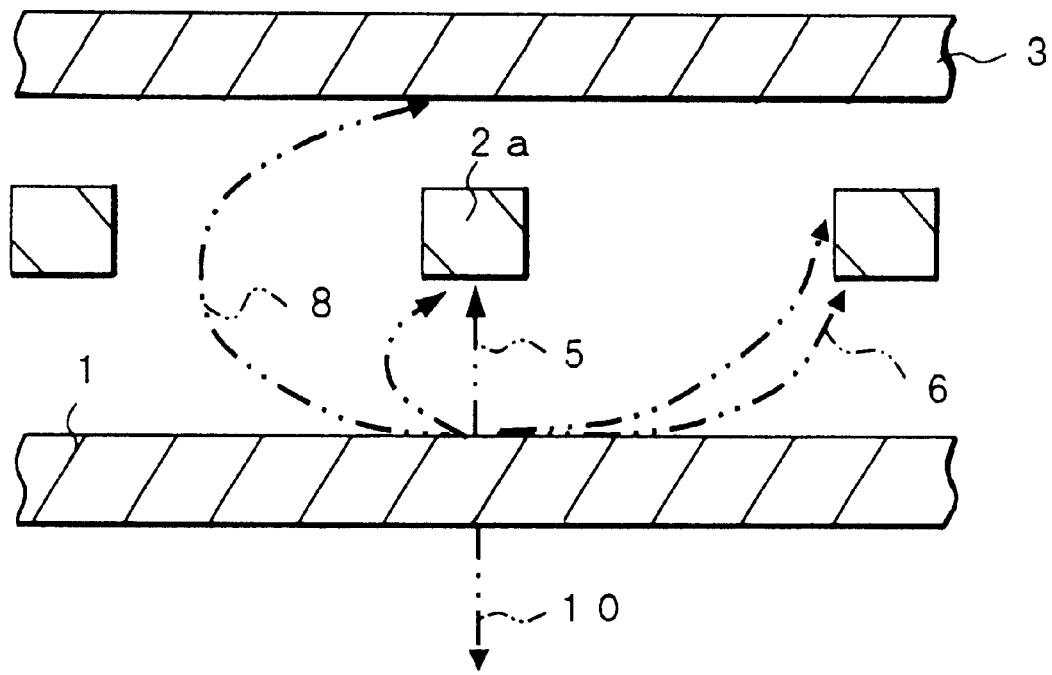
Figure 10B:
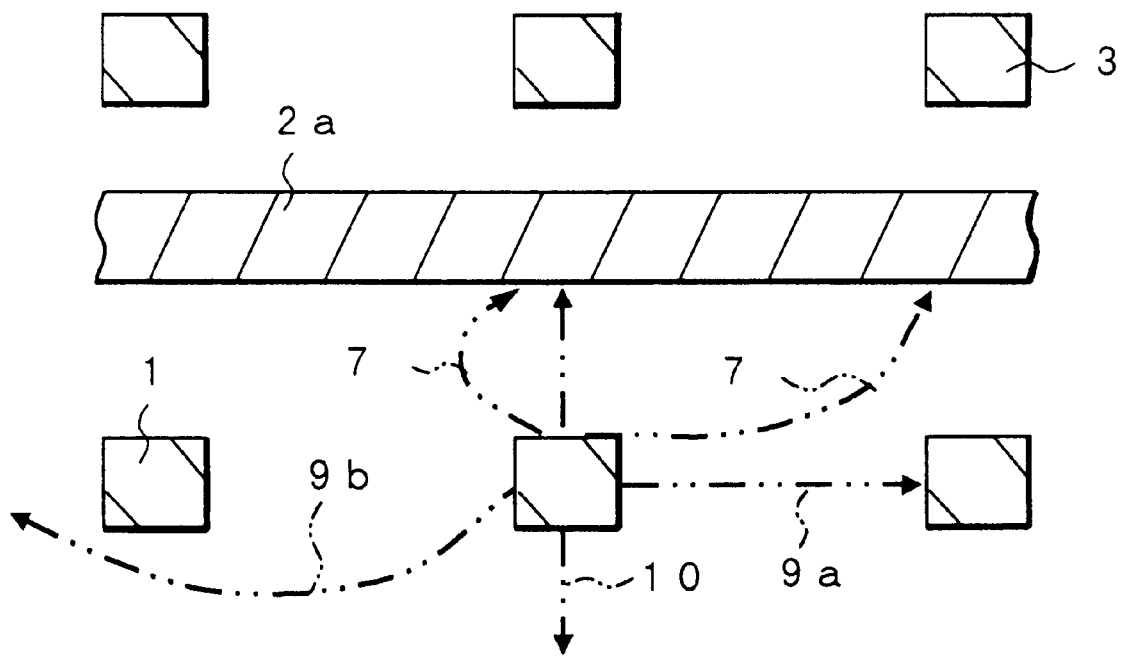

Such parasitic capacitance is also created beyond the adjoining wiring and the nearest layer. FIGS. 10A and 10b are schematic diagrams showing electric lines of force extending from RAM macro wiring 1 in a semiconductor device. FIG. 10A shows the aspects of the electric lines of force in a cross section along the macro wiring 1 in FIG. 9. FIG. 10B shows the aspects of the electric lines of force in a cross section along the conductive layer 2a in FIG. 9. These cross sections are orthogonal to each other. Assume that the shield layer 2 is at the GND potential, that the particular RAM macro wiring 1 exhibits the VDD potential, and that the remaining RAM macro wirings and all the over-macro through wirings 3 exhibit the GND potential.

As shown in FIG. 10A, in the cross section orthogonal to the conductive layer 2a of the shield layer 2, electric lines of force 5 extend from the RAM macro wiring 1 of VDD potential toward the conductive layer 2a opposed to a side of this RAM macro wiring 1. Besides, electric lines of force 6 extend around to an adjacent conductive layer other than the conductive layer 2a opposed to the side of the RAM macro wiring 1. Moreover, an electric line of force 8 extends from the RAM macro wiring 1, passing by the conductive layer 2a toward the over-macro through wiring 3 of GND potential. An electric line of force 10 extends toward the substrate.

In the cross section shown in FIG. 10B taken along the shield layer 2, a plurality of electric lines of force 7 extend toward the conductive layer 2a opposed to the side of the RAM macro wiring 1, and the electric line of force 10 extends toward the substrate. Electric lines of force 9a and 9b also extend to adjoining RAM macro wiring 1 and RAM macro wiring other than the adjoining wiring, respectively. As shown in FIGS. 10A and 10B, the electric lines of force extending from the RAM macro wiring 1 tend to head for the shield layer 2 above; therefore, the electric lines of force 5 and 7 between this RAM macro wiring 1 and the conductive layer 2a of the shield layer 2 are the highest in density.

In view of the electric lines of force shown in FIGS. 10A and 10B, the consideration of the parasitic capacitance on the RAM macro wiring 1 also needs to involve the capacitances resulting from the detours to peripheral layers. Such parasitic capacitance depends greatly on the overlapping areas between layers and the distances between the layers, as well as the to-substrate, wire-to-wire, and interlayer permittivities. Accordingly, the interlayer capacitance $C_2$ generated between the RAM macro wiring 1 and the shield layer 2 is greater than the to-substrate capacitance $C_4$ generated between the RAM macro wiring 1 and the substrate, the wire-to-wire capacitance $C_5$ generated between wires, and the like.

Figure 7:
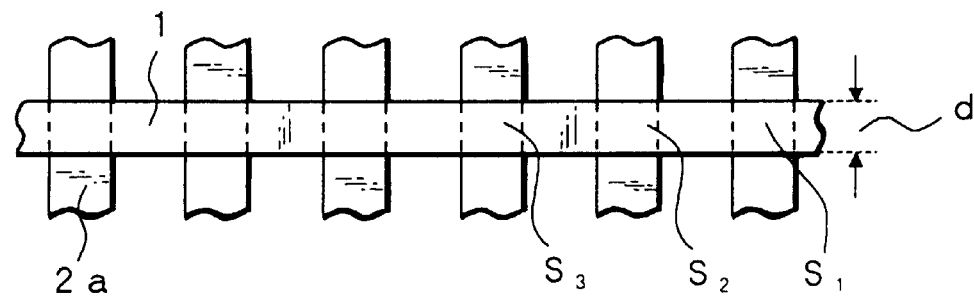
FIG. 7 is a bottom view showing how the shield layer and the RAM macro wiring of the SRAM shown in FIG. 6 overlap with each other.
Figure 8:
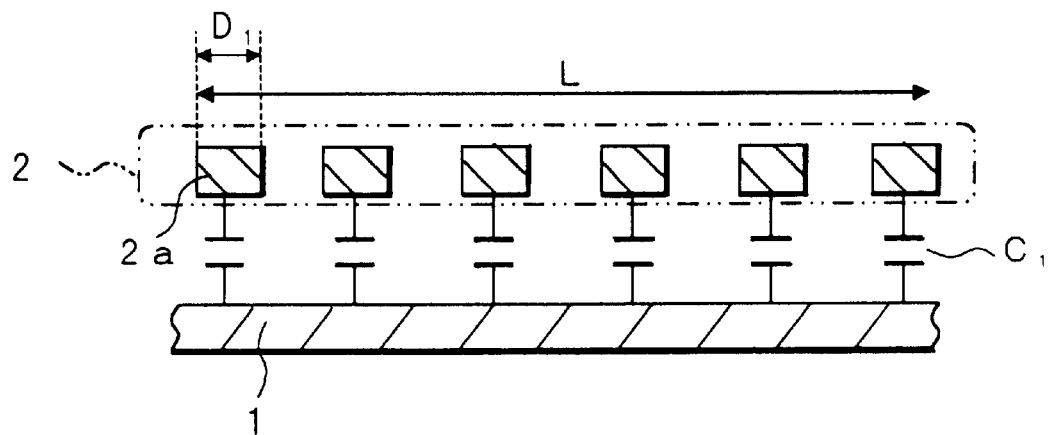
FIG. 8 is a schematic diagram showing the interlayer capacitances between the shield layer and the RAM macro wiring in a cross section taken along the RAM macro wiring of the SRAM shown in FIG. 6.

FIGS. 7 and 8 are diagrams showing the SRAM of the present embodiment. FIG. 7 is a bottom view showing how the shield layer and the RAM macro wiring shown in FIG. 6 overlap with each other. FIG. 8 is a schematic diagram showing the interlayer capacitances between the shield layer and the RAM macro wiring in a cross section taken along the RAM macro wiring shown in FIG. 6. Moreover, FIGS. 4 and 5 are diagrams showing the SRAM of the prior art 2. FIG. 4 is a bottom view showing how the shield layer and the RAM macro wiring shown in FIG. 3 overlap with each other. FIG. 5 is a schematic diagram showing the interlayer capacitance between the shield layer and the RAM macro wiring in a cross section along the RAM macro wiring shown in FIG. 3. Assume that, in FIGS. 7, 8 and FIGS. 4, 5, the interlayer capacitance appearing on the RAM macro wiring 1 is C, the interlayer capacitance on the RAM macro wiring 1 per unit area is $C_S$, the total area of the overlap between the RAM macro wiring 1 and the shield layer 2 is S, the wiring width of the RAM macro wiring 1 is d, and the total length of the overlap between the RAM macro wiring 1 and the shield layer 2 is X. Then, the equation (1) shown below holds.

$$C\ C_S \times d \times X = C_S \times S \tag{1}$$

Incidentally, in the case where the shield layer 2 shown in FIGS. 7 and 8 is composed of a plurality of conductive layers 2a, it is assumed that the respective overlapping areas of the RAM macro wiring 1 and the conductive layers 2a are $S_1, S_2, S_3, \ldots S_n$, and the total sum thereof is the total area S.

Figure 1:
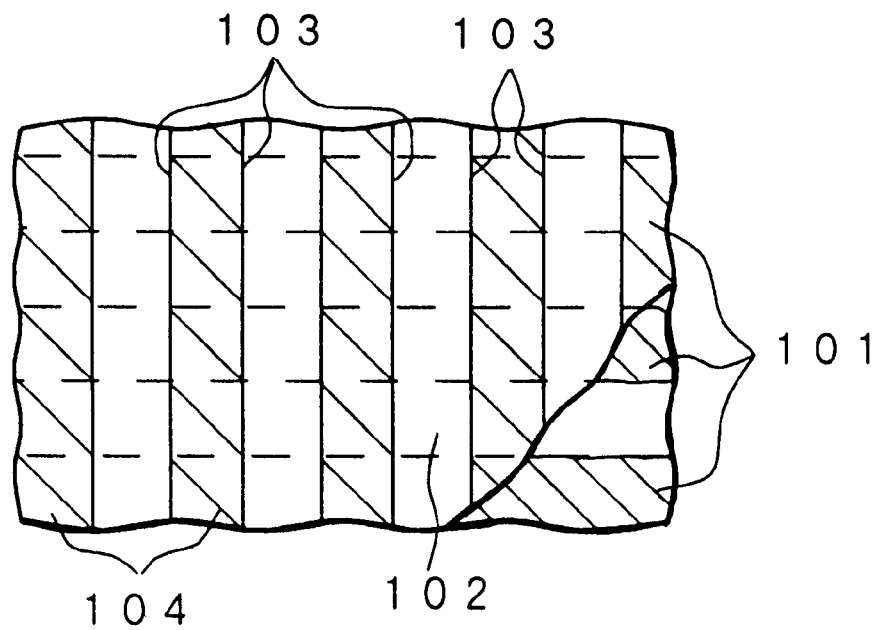
FIG. 1 is a top view showing a semiconductor memory device described in the prior art 1.
Figure 2:
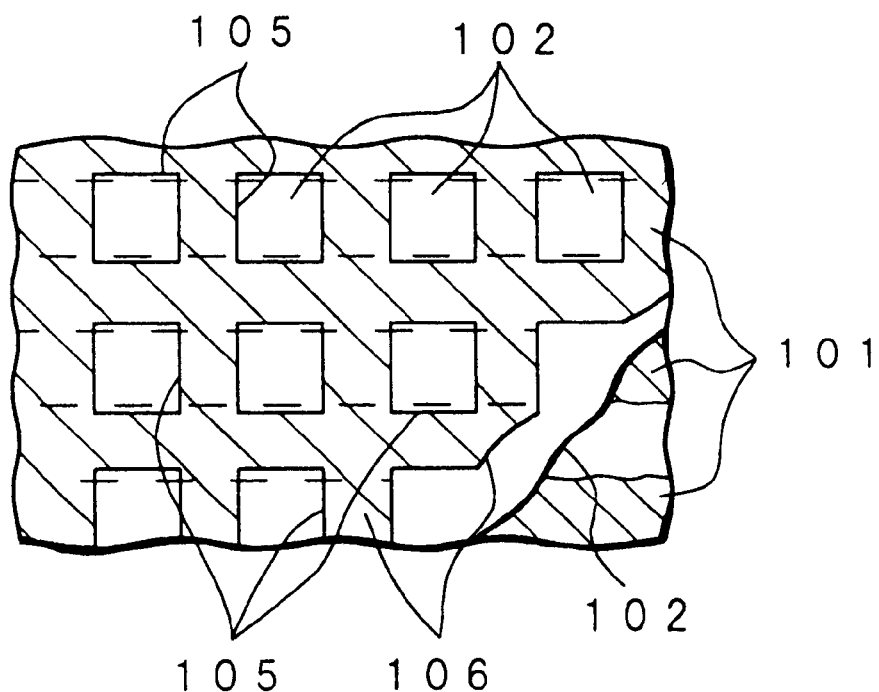
FIG. 2 is a top view showing another semiconductor memory device described in the prior art 1.
Figure 3:
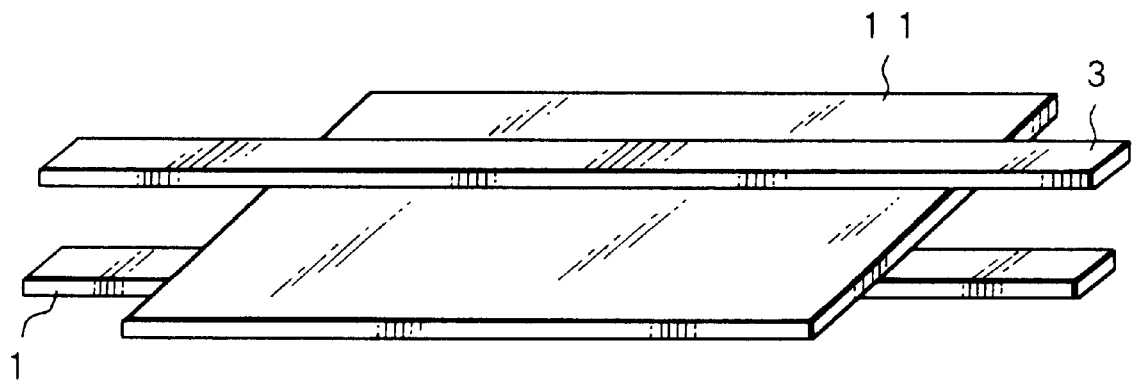
FIG. 3 is a perspective view showing an SRAM in the prior art 2.
Figure 4:
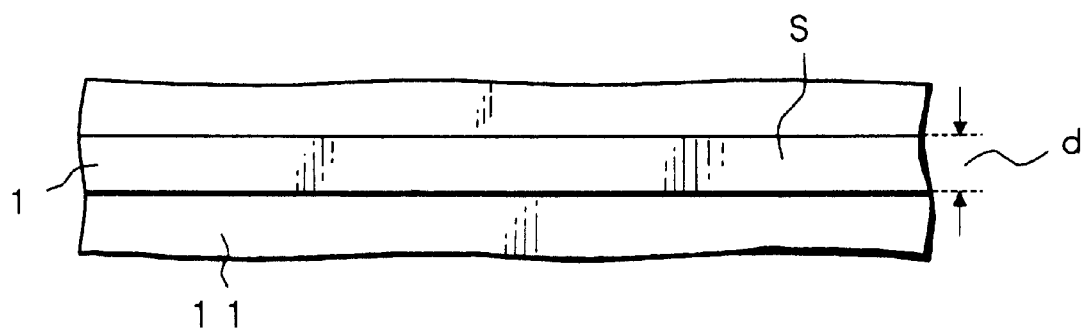
FIG. 4 is a bottom view showing how the shield layer and the RAM macro wiring of the SRAM shown in FIG. 3 overlap with each other.
Figure 5:
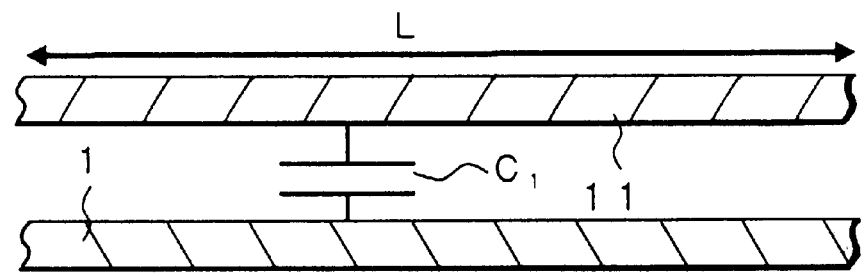
FIG. 5 is a schematic diagram showing the interlayer capacitance between the shield layer and the RAM macro wiring in a cross section taken along the RAM macro wiring of the SRAM shown in FIG. 3.

In such a configuration that the shield layer 11 is formed all over the RAM macro wiring 1 as in the prior art 2 shown in FIGS. 3–5, the overlapping area S of the layers becomes equal to the area of the RAM macro wiring 1. That is, in the RAM macro wiring 1 having a wiring length of L, the overlapping area $S = d \times X = d \times L$. Meanwhile, in the present embodiment, the stripe configuration of the shield layer 2 reduces the total length L of the overlaps between the layers by the pitches $W_1$ between the stripe conductive layers. This allows a reduction of the interlayer capacitance between the shield layer 2 and the RAM macro wiring 1.

As described above, the parasitic capacitance on the RAM macro wiring 1 has the interlayer capacitance $C_1$ to the shield layer 2 as the greatest proportion. Therefore, the following holds as far as the parasitic capacitance is restricted to only the interlayer capacitance $C_1$ between the RAM macro wiring 1 and the shield layer 2. For example, stripe conductive layers of $D_1$ in width are arranged at the equal pitch $W_1$ to form the shield layer 2 of stripe configuration, the overlapping area $S=d\times X=d\times L/2$. This means a ½ reduction of the interlayer capacitance between the RAM macro wiring 1 and the shield layer 2.

Figure 11:
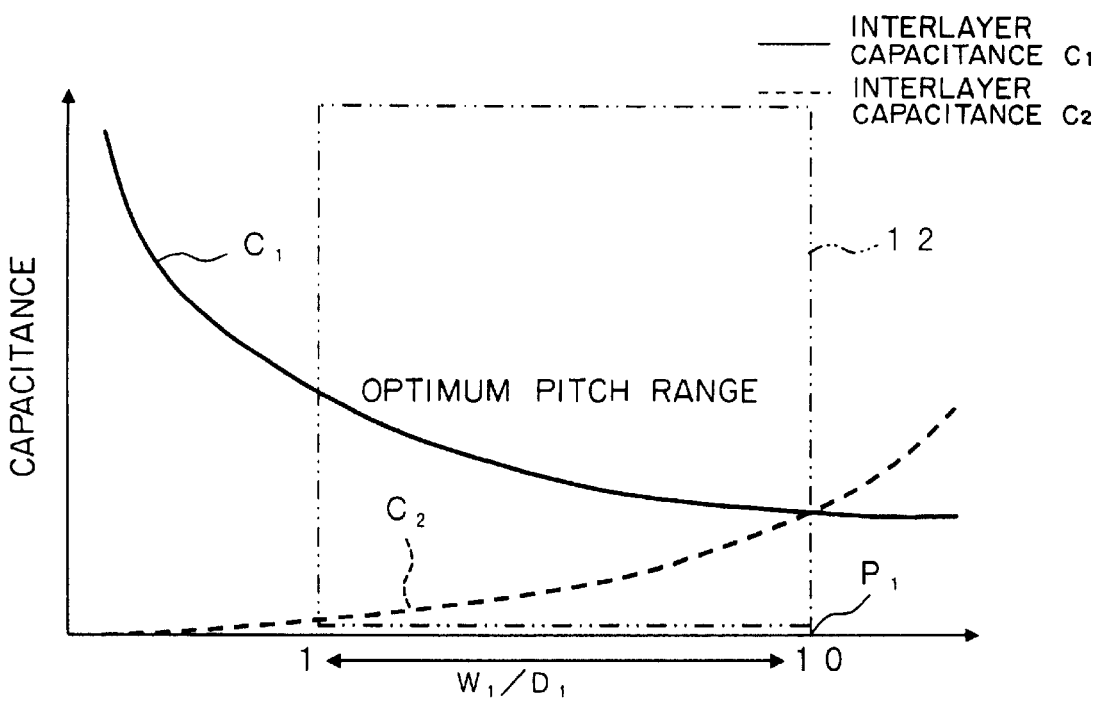
FIG. 11 is a graph showing the relation of the interlayer capacitance between virtual RAM macro wiring and over-macro through wiring to the pitch of the stripe conductive layers in a shield layer.

FIG. 11 is a graph showing the relation of the interlayer capacitance ($C_2$) between virtual RAM macro wiring and over-macro through wiring to the magnitude of the pitch $W_1$ of the stripe conductive layers in the shield layer with respect to the width $D_1$ ($W_1/D_1$). FIG. 11 shows the interlayer capacitance in the semiconductor device shown in FIG. 6. The horizontal coordinate of the graph represents the magnitude of the pitch $W_1$ of the stripe conductive layers. The zero point indicates that the pitch $W_1$ is "0", i.e., the shield layer is formed all over as in the prior art 2 shown in FIG. 3. The vertical coordinate represents the magnitude of capacitance. In FIG. 11, the broken line shows the value of the interlayer capacitance $C_2$ to appear between the RAM macro wiring 1 and the over-macro through wiring 3. The full line shows the value of the interlayer capacitance $C_1$ between the RAM macro wiring 1 and the shield layer 2. The interlayer capacitance $C_2$ between the RAM macro wiring 1 and the over-macro through wiring 3 is "0" when the pitch of the conductive layers 2a is "0," i.e., when the shield layer is formed all over as shown in FIG. 3.

As shown in FIG. 11, the interlayer capacitance $C_2$ increases as the pitch $W_1$ of the stripe conductive layers 2a becomes greater. This is attributable to the development of electric lines of force extending from the RAM macro wiring 1 to the over-macro through wiring 3 through between the conductive layers 2a of the shield layer 2. Meanwhile, the area S for the shield layer 2 to overlap with the RAM macro wiring 1 decreases by the amount of (the pitches $W_1$ between the conductive layers 2a)×(the width d of the RAM macro wiring). As a result, the interlayer capacitance $C_1$ between the RAM macro wiring 1 and the shield layer 2 becomes smaller.

Interlayer capacitance is formed between different layers, and is proportional to the overlapping area of the layers and inversely proportional to the distance between the layers. The distance from the RAM macro wiring 1 to the shield layer 2 is shorter than the distance to the over-macro through wiring 3. Therefore, provided that the areas are identical, the interlayer capacitance $C_1$ between the RAM macro wiring 1 and the shield layer 2 is greater than the interlayer capacitance $C_2$. Accordingly, widening the pitch $W_1$ of the stripe conductive layers 2a to reduce the overlapping area S of the shield layer 2 and the RAM macro wiring 1 decreases the interlayer capacitance $C_1$ in a higher rate than the increased electric lines of force passing through between the conductive layers 3a lifts up the interlayer capacitance $C_2$. On this account, too wide a pitch $W_1$ with respect to the width $D_1$ of the conductive layers in the shield layer 2 reduces the interlayer capacitance $C_1$ between the RAM macro wiring 1 and the shield layer 2, whereas the noises from the over-macro through wiring 3 affect the RAM macro wiring 1 for a RAM malfunction. Moreover, since the interlayer capacitance $C_2$ between the RAM macro wiring 1 and the over-macro through wiring 3 is generated at the regions where the RAM macro wiring 1 and the shield layer 2 make no overlap, the widened pitches $W_1$ of the conductive layers 2a can also increase the interlayer capacitance $C_2$. To avoid noises from the over-macro through wiring 3 so as to reduce the interlayer capacitance $C_1$ in such a range that the RAM macro wiring 1 causes no malfunction resulting from the noises of the over-macro through wiring 3 and to suppress the interlayer capacitance $C_2$ as well, the pitch $W_1$ of the conductive layers is made equal to or smaller than $P_1$, where $P_1$ is the pitch at which the interlayer capacitance $C_1$ and the interlayer capacitance $C_2$ become equal to each other. Now, narrower pitches $W_1$ of the conductive layers increase the interlayer capacitance $C_1$ between the RAM macro wiring 1 and the shield layer 2. Therefore, in FIG. 11, the pitch $W_1$ of the conductive layers is preferably equal to or greater than the width $D_1$ of the conductive layers, and the optimum pitch range 12 lies between 1 and 10 times the width $D_1$ of the conductive layers.

For the reasons mentioned above, the shield layer for suppressing noises from the through wiring over the macro is formed into a plurality of conductive layers arranged parallel to each other with gaps therebetween so that the interlayer capacitance on the RAM macro wiring can be reduced in such a range that the noises from the over-macro through wiring are prevented from affecting the RAM macro wiring and causing the RAM macro circuit to malfunction. That is, it is possible to reduce the interlayer capacitance between the RAM macro wiring and the shield layer and to suppress the interlayer capacitance between the RAM macro wiring and the over-macro through wiring as well.

Figure 12:
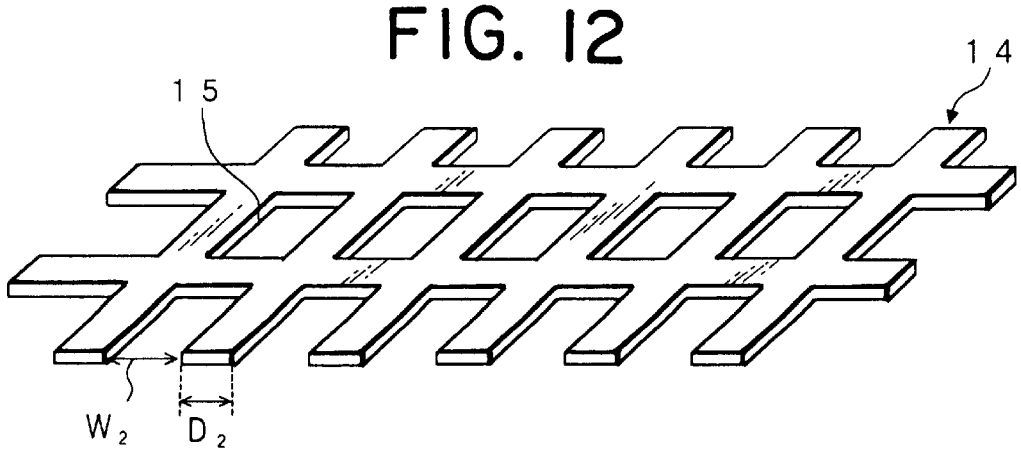
FIG. 12 is a perspective view showing the shield layer according to a second embodiment of the present invention.

Now, description will be given of a second embodiment of the present invention. FIG. 12 is a perspective view showing a shield layer according to the present embodiment. In the first embodiment, it is the shield layer 2 of stripe configuration that is formed between the RAM macro wiring 1 and the over-macro through wiring 3. In the present invention, a GND shield layer 14 of mesh configuration is formed as shown in FIG. 12. Here, the mesh-like shield layer 14 is placed with its openings 15 directly above the RAM macro wiring. As in the first embodiment, the shield layer 14 in the present embodiment may be supplied with either of the GND potential and the VDD potential, for the RAM macro wiring and the over-macro wiring exhibit both the VDD potential and the GND potential. Like the conductive layer pitch $W_1$ and the conductive layer width $D_1$ in the first embodiment, the opening width $W_2$ and the mesh width $D_2$, or the pitch between the openings 15, in the direction along the RAM macro wiring 1 are defined as follows: That is, the opening width $W_2$ is defined to be equal to or smaller than $P_2$, where $P_2$ is the pitch at which the interlayer capacitance $C_3$ between the RAM macro wiring 1 and the shield layer 14 becomes equal to the interlayer capacitance $C_2$ between the RAM macro wiring and the over-macro through wiring.

Such a mesh-like configuration of the shield layer can offer the same effects as those of the first embodiment, whereby the area of the shield layer can be reduced to suppress the interlayer capacitance between the RAM macro wiring and the over-macro through wiring in such a range that noises between wirings can be avoided.

Figure 13:
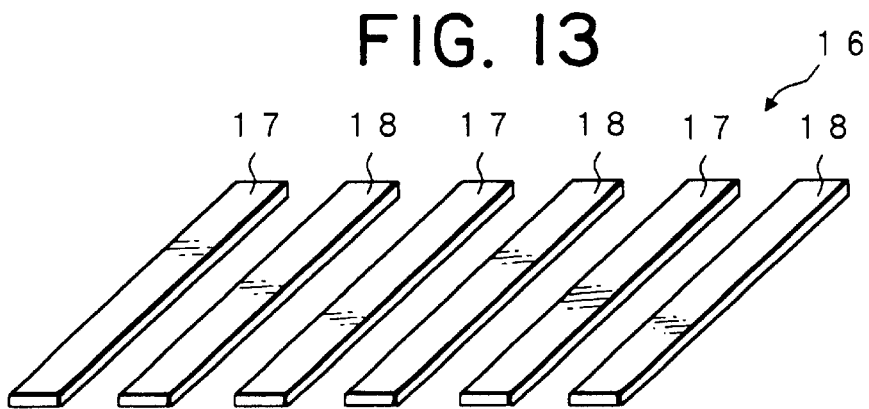
FIG. 13 is a perspective view showing the shield layer according to a third embodiment of the present invention.

Now, description will be given of a third embodiment of the present invention. FIG. 13 is a perspective view showing a shield layer according to the present embodiment. As shown in FIG. 13, a shield layer 16 to be formed between the RAM macro wiring and over-macro through wiring comprises conductive layers of stripe configuration as in the first embodiment. The plurality of conductive layers constituting the shield layer 16 of the present embodiment are connected with VDD and GND alternately. This means that VDD conductive layers 17 and GND conductive layers 18 are alternately arranged in parallel to one another. Then, contacts are formed in an interlayer insulative film between this shield layer 16 and a semiconductor substrate so that the VDD conductive layers 17 and the GND conductive layers 18 of the shield layer 16 are connected to RAM macro cells on the semiconductor substrate. Thereby, VDD and GND are supplied to the RAM cells from the VDD conductive layers 17 and the GND conductive layers 18.

Such a configuration forms the stripe shield layer 16 rather than a shield layer consisting of conductive layers laid tightly over the RAM macro wiring, thereby allowing a reduction of the overlapping area with the RAM macro wiring 1. As a result, the interlayer capacitance can be reduced in such a range that the noises from the over-macro through wiring exert no effect on the RAM cells. Moreover, the power supply and GND can be supplied to the RAM cells from the shield layer 16, which allows a reduction of the RAM layout area.

As has been described in detail, according to the present invention, a shield layer of stripe configuration or mesh configuration is arranged between RAM macro wiring and over-macro through wiring, whereby the total area of the shield conductive layers opposed to the RAM macro wiring decreases to reduce the interlayer capacitance. The shield layer has the conductive layers arranged at a pitch of $W_1$, or has openings at a pitch of $W_2$. These pitches are defined to be equal to or smaller than a pitch at which the interlayer capacitance between the RAM macro wiring and the shield layer becomes equal to the interlayer capacitance between the RAM macro wiring and the over-macro through wiring. This definition allows the interlayer capacitance appearing on the RAM macro wiring to be lowered in such a range that the noises from the over-macro through wiring exert no effect on the RAM macro wiring.

In addition, the parasitic capacitance appearing on macro wiring including RAM digit lines can be reduced to enhance the read and write speeds between RAM cells and sense amplifiers as well as write buffers, thereby improving the speed of the RAM macro.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A semiconductor memory comprising a shield layer between macro wiring inside a macro and through wiring over said macro, said shield layer having a plurality of conductive layers arranged parallel to each other at a pitch of $W_1$, said conductive layers extending in a direction orthogonal to said macro wiring, the pitch $W_1$ of said conductive layers being equal to or smaller than $P_1$, where $P_1$ is a pitch of said conductive layers at which the interlayer capacitance between said macro wiring and said shield layer becomes equal to the interlayer capacitance between said macro wiring and said over-macro through wiring.

2. The semiconductor memory according to claim 1, wherein said shield layer is connected with a ground.

3. The semiconductor memory according to claim 1, wherein said shield layer is connected with a power supply.

4. The semiconductor memory according to claim 1, wherein said conductive layers of said shield layer are connected alternately with a ground and a power supply.

5. The semiconductor memory according to claim 4, wherein contacts formed in an insulative film between said shield layer and a semiconductor substrate connect said conductive layers of said shield layer to RAM cells, so that a power supply and a ground are supplied from said shield layer to said RAM cells via said contacts.

6. A semiconductor memory comprising a mesh-like shield layer between macro wiring inside a macro and through wiring over said macro, said shield layer having a plurality of openings each having an opening width of $W_2$ along the longitudinal direction of said macro wiring, the opening width $W_2$ being equal to or smaller than $P_2$, where $P_2$ is an opening width at which the interlayer capacitance between said macro wiring and said shield layer becomes equal to the interlayer capacitance between said macro wiring and said over-macro through wiring.

7. The semiconductor memory according to claim 6, wherein said shield layer is connected with a ground.

8. The semiconductor memory according to claim 6, wherein said shield layer is connected with a power supply.

* * * * *